(12) United States Patent
Sazawa et al.

(10) Patent No.: US 7,951,685 B2
(45) Date of Patent: May 31, 2011

(54) METHOD FOR MANUFACTURING SEMICONDUCTOR EPITAXIAL CRYSTAL SUBSTRATE

(75) Inventors: Hiroyuki Sazawa, Tsukuba (JP); Naohiro Nishikawa, Ichihara (JP); Masahiko Hata, Tsuchiura (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 121 days.

(21) Appl. No.: 12/310,984

(22) PCT Filed: Sep. 14, 2007

(86) PCT No.: PCT/JP2007/068476
§ 371 (c)(1),
(2), (4) Date: Mar. 30, 2009

(87) PCT Pub. No.: WO2008/032873
PCT Pub. Date: Mar. 20, 2008

(65) Prior Publication Data
US 2010/0084742 A1 Apr. 8, 2010

(30) Foreign Application Priority Data

Sep. 15, 2006 (JP) .................................. 2006-250967
Jun. 12, 2007 (JP) .................................. 2007-154709

(51) Int. Cl.
*H01L 21/76* (2006.01)
(52) U.S. Cl. ........ 438/416; 438/417; 438/311; 438/680; 257/E21.006; 257/E21.17; 257/E21.32; 257/E21.092; 257/E21.121; 257/E21.115; 257/E21.117; 257/E21.218; 257/E21.278; 257/E21.267; 257/E21.293
(58) Field of Classification Search ................... 438/416, 438/417, 513, 508, 505, 311, 603, 604, 663, 438/680, 753, 931; 257/E21.17, 32, 92, 117, 115, 121, 218, 6, 278, 267, 293
See application file for complete search history.

(56) References Cited

U.S. PATENT DOCUMENTS 5,633,516 A * 5/1997 Mishima et al. ............... 257/190
(Continued)

FOREIGN PATENT DOCUMENTS

GB 2354370 3/2001
(Continued)

OTHER PUBLICATIONS

Kordos et al., "High-power $SiO_2$/AlGaN/GaN metal-oxide-semiconductor heterostructure field-effect transistors," *Applied Physics Letters*, 2005, vol. 87, 143501-1 through 143501-3.

(Continued)

*Primary Examiner* — David Nhu
(74) *Attorney, Agent, or Firm* — Fitch, Even, Tabin & Flannery (57) ABSTRACT

The present invention provides a method for manufacturing a gallium nitride semiconductor epitaxial crystal substrate with a dielectric film which has a low gate leak current and negligibly low gate lag, drain lag, and current collapse characteristics. The method for manufacturing a semiconductor epitaxial crystal substrate is a method for manufacturing a semiconductor epitaxial crystal substrate in which a dielectric layer of a nitride dielectric material or an oxide dielectric material in an amorphous form functioning as a passivation film or a gate insulator is provided on a surface of a nitride semiconductor crystal layer grown by metal organic chemical vapor deposition. In the method, after the nitride semiconductor crystal layer is grown in an epitaxial growth chamber, the dielectric layer is grown on the nitride semiconductor crystal layer in the epitaxial growth chamber.

8 Claims, 5 Drawing Sheets

U.S. PATENT DOCUMENTS

| | | | |
|---|---|---|---|
| 5,949,096 A | 9/1999 | Ohkubo et al. | |
| 6,380,050 B1 * | 4/2002 | Wang et al. | 438/478 |
| 2005/0249876 A1 | 11/2005 | Kawahara et al. | |

FOREIGN PATENT DOCUMENTS

| | | |
|---|---|---|
| JP | 2000-058454 | 2/2000 |
| JP | 2001-068414 | 3/2001 |
| JP | 2004-023043 | 1/2004 |
| JP | 2004-531874 | 10/2004 |
| JP | 2005-268507 | 9/2005 |
| JP | 2005-322668 | 11/2005 |
| WO | WO 02/43125 | 5/2002 |

OTHER PUBLICATIONS

Hashizume et al., "Surface passivation of GaN and GaN/AlGaN heterostructures by dielectric films and its application to insulated-gate heterostructure transistors," *J. Vac. Sci. Technol. B*, vol. 21, No. 4, Jul./Aug. 2003, pp. 1828-1838.

\* cited by examiner

METHOD FOR MANUFACTURING SEMICONDUCTOR EPITAXIAL CRYSTAL SUBSTRATE

CROSS-REFERENCE TO RELATED APPLICATIONS

This is a U.S. National Phase of International Application PCT/JP2007/068476, filed Sep. 14, 2007, and claims the benefit of priority under 35 U.S.C. §119 based on Japanese Application No. 2006-250967, filed Sep. 15, 2006, and Japanese Application No. 2007-154709, filed Jun. 12, 2007, the entire disclosures of which applications are hereby incorporated herein by reference.

TECHNICAL FIELD

The present invention relates to a semiconductor epitaxial crystal substrate and manufacturing method of the substrate.

BACKGROUND ART

Recently, a device having a two-dimensional electron gas channel at a hetero interface has received substantial attention because of its excellent performances in high-frequency and high-power drive. The GaN transistors are manufactured by processing a epitaxially grown semiconductor crystal by lithography technique. At that time, a gate insulator or/and a passivation film can be stacked on top of the crystal according to a purpose.

The gate insulator is a protective film inserted between a gate metal and a semiconductor crystal for the purpose of preventing a leak current on the gate. In general, it is known that a Schottky electrode formed on a nitride semiconductor exhibits a larger leak current than theoretically expected, and the gate insulator is often introduced to improve the leak characteristics.

The passivation film is a protective film stacked on top of the crystal for the purpose of stabilizing electrical properties of the crystal surface. Unstable electrical property on the crystal surface can lead to a reduction in output and fluctuations in threshold voltage thorough transient responses such as a gate lag, a drain lag, or current collapse phenomena. Accordingly, the film introduced to prevent such degradations as needed.

For the purpose of simplifying manufacturing steps and reducing manufacturing cost, it is often the case that insulator and a dielectric film are commonly used for both protection. In a conventional method, the dielectric film has been over stacked by a thermal CVD, plasma CVD, cat-CVD (catalytic chemical vapor deposition) or the like on the a nitride semiconductor crystal layer that is grown by crystal growth techniques such as metal organic chemical vapor deposition (MOCVD), molecular beam epitaxy (MBE), or the like. Where, an acid treatment is carried out on a nitride crystal surface to remove a natural oxide formed under the atmosphere exposure during the substrate transfer from the crystal growth chamber to the CVD chamber. For example, in P. Kordos et al., Applied Physics Letters 87, 143501 (2005), there is disclosed a GaN-MISHFET in which a SiO dielectric material is provided on a semiconductor surface by plasma CVD.

This example shows the result that a gate leak current was reduced by introducing the dielectric film. However, in the conventional method including this method, it is impossible to completely remove the natural oxide at an interface between the semiconductor crystal and the insulator. Additionally, it suffers nitrogen vacancies formation on a nitride crystal surface. The nitrogen vacancy can be the factor of electrically unstable surface by forming intermediate level. Hence, the transistor manufactured by the conventional method often exhibits a drain lag, a gate lag, or the like. That is, in accordance with the conventional methods, an effect of passivation by the dielectric film has been insufficient, and therefore there has been a problem in putting the methods into practical use.

DISCLOSURE OF THE INVENTION

An object of the present invention is to provide a semiconductor epitaxial crystal substrate with a over stacked dielectric film provided thereon and a method for manufacturing the same which can solve the foregoing problems.

The present inventors have completed the present invention as a result of their dedicated study to solve the foregoing problems. That is, the present invention provides the following (1) to (8).

(1) A method for manufacturing a semiconductor epitaxial crystal substrate in which a dielectric layer of a nitride dielectric material or an oxide dielectric material in an amorphous form functioning as a passivation film or a gate insulator is provided on a surface of a nitride semiconductor crystal layer grown by metal organic chemical vapor deposition, comprising:

growing the nitride semiconductor crystal layer in an epitaxial growth chamber; and then growing the dielectric layer on the nitride semiconductor crystal layer in the epitaxial growth chamber.

(2) The method of (1) described above, wherein the dielectric layer is grown using an organic metal as a metal material, ether or water as an oxygen material, and ammonia as a nitrogen containing material by the metal organic chemical vapor deposition.

(3) The method of (2) described above, wherein at least a part of the growth of the dielectric layer is performed while ammonia as a group V material is supplied.

(4) The method of (1), (2), or (3) described above, wherein at least a part of the growth of the dielectric layer is performed by using nitrogen as a carrier gas.

(5) The method of (1) or (2) described above, wherein the dielectric layer contains at least one dielectric material selected from among $AlO_x$, $AlO_x$:N ($0.5<x<1.5$), $SiO_2$, $SiO_2$:N, $Ga_2O_3$, $Si_3N_4$, $HfO_2$, $Hf_xAl_yO_3$ ($0<x<1$, $y=2-\frac{1}{2}x$), $Hf_xAl_yO_3$:N ($0<x<1$, $y=2-\frac{1}{2}x$), GdO, $ZrO_2$, MgO, and $Ta_2O_5$.

(6) The method of (1) or (2) described above, wherein the dielectric layer contains at least one dielectric material selected from among $Al_2O_3$, $Al_2O_3$:N, $SiO_2$, $SiO_2$:N, $Ga_2O_3$, $Si_3N_4$, $HfO_2$, $Hf_xAl_yO_3$ ($0<x<1$, $y=2-\frac{1}{2}x$), $Hf_xAl_yO_3$:N ($0<x<1$, $y=2-\frac{1}{2}x$), GdO, $ZrO_2$, MgO, and $Ta_2O_5$.

(7) The method of any one of (1) to (6) described above, wherein the semiconductor epitaxial crystal substrate is used for a field effect transistor.

(8) A semiconductor epitaxial crystal substrate which is obtained by the method of any one of (1) to (6).

EXPLANATION OF REFERENCE 1 base substrate
2 buffer layer
3 channel layer
4 electron supply layer
5 dielectric layer
6 drain electrode
7 gate electrode
8 source electrode
9 device isolation
10 semiconductor epitaxial crystal substrate
100 to 104 mass flow controllers
105, 106 thermostatic bath
107, 108 material vessel
109 to 111 high-pressure gas cylinder
112 to 114 pressure-reducing valves
200 reactor
201 substrate holder
202 photoresistance heater
203 exhaust vent

MODE FOR CARRYING OUT THE INVENTION

Figure 1:
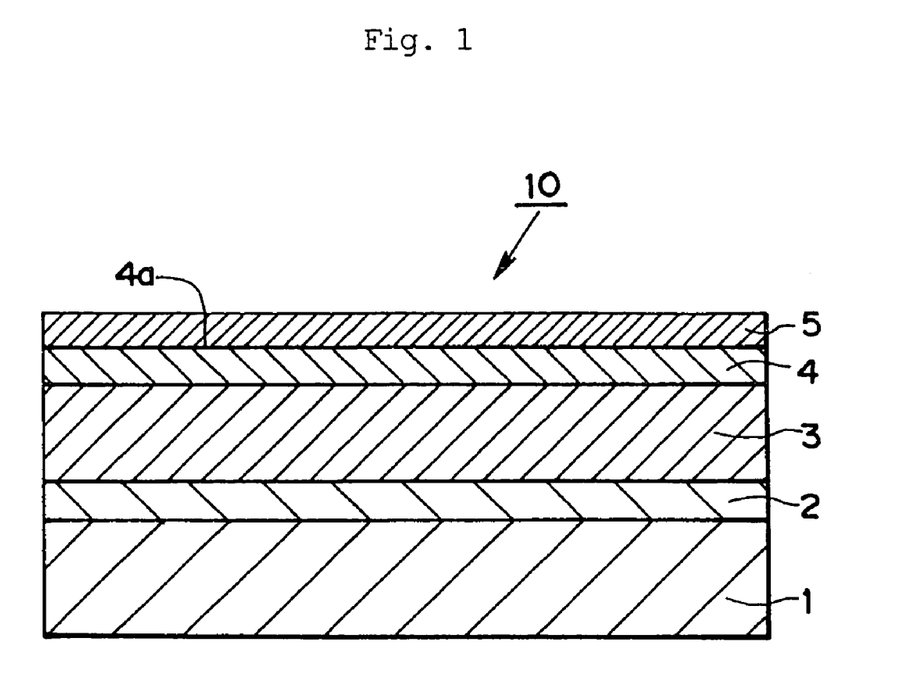
FIG. 1 is a schematic cross-sectional view of a semiconductor epitaxial crystal substrate according to the present invention.

FIG. 1 is a schematic cross-sectional view of a semiconductor epitaxial crystal substrate obtained by a manufacturing method according to the present invention. A semiconductor epitaxial crystal substrate 10 is a gallium nitride semiconductor epitaxial crystal substrate used for manufacturing transistors, and a gallium nitride semiconductor crystal layer is grown on a base substrate 1 by the epitaxy. The gallium nitride semiconductor crystal layer includes an AlN buffer layer 2, a GaN channel layer 3, and a Si-doped/Si-undoped electron supply layer 4 in this order.

On the surface of the gallium nitride semiconductor crystal layer, i.e., on a surface 4a of the electron supply layer 4, a dielectric layer 5 in an amorphous form having a predetermined thickness is grown. The dielectric layer 5 is a protective layer for the gallium nitride semiconductor crystal layer, and functions as a passivation film or a gate insulator in a transistor manufactured by using the semiconductor epitaxial crystal substrate 10.

After the buffer layer 2, the channel layer 3, and the electron supply layer 4 are successively grown on the base substrate 1 in an epitaxial growth chamber, the dielectric layer 5 is successively grown on the electron supply layer 4 by MOCVD in the same epitaxial growth chamber. Examples of the dielectric material that can be grown by the MOCVD include $AlO_x$, $AlO_x{:}N$ ($0.5<x<1.5$), $Si_3N_4$, $SiO_2$, $SiO_2{:}N$ ($SiO_2$ containing N), MgO, GdO, $ZrO_2$, $HfO_2$, $Hf_xAl_yO_3$ ($0<x<1$, $y=2-\frac{1}{2}x$), $Hf_xAl_yO_3{:}N$ ($Hf_xAl_yO_3$ containing N) ($0<x<1$, $y=2-\frac{1}{2}x$), $Ta_2O_5$ and MgO. For $AlO_x$, $Al_2O_3$ is preferable, while for $AlO_x{:}N$ ($0.5<x<1.5$), $Al_2O_3{:}N$ is preferable. The dielectric layer 5 may be grown by, e.g., introducing a group III material gas into the epitaxial growth chamber and performing MOCVD while an oxygen material is introduced.

When the dielectric layer 5 thus obtained functions as the passivation film or the gate insulator, an excellent gate leak characteristic can be achieved without lowering electric characteristics of a transistor. As a result, there is obtained a semiconductor epitaxial crystal substrate having an excellent gate leak characteristic, and a negligibly low drain lag, gate lag, and current collapse.

A description will be given of an embodiment of the manufacturing method according to the present invention.

Figure 2:
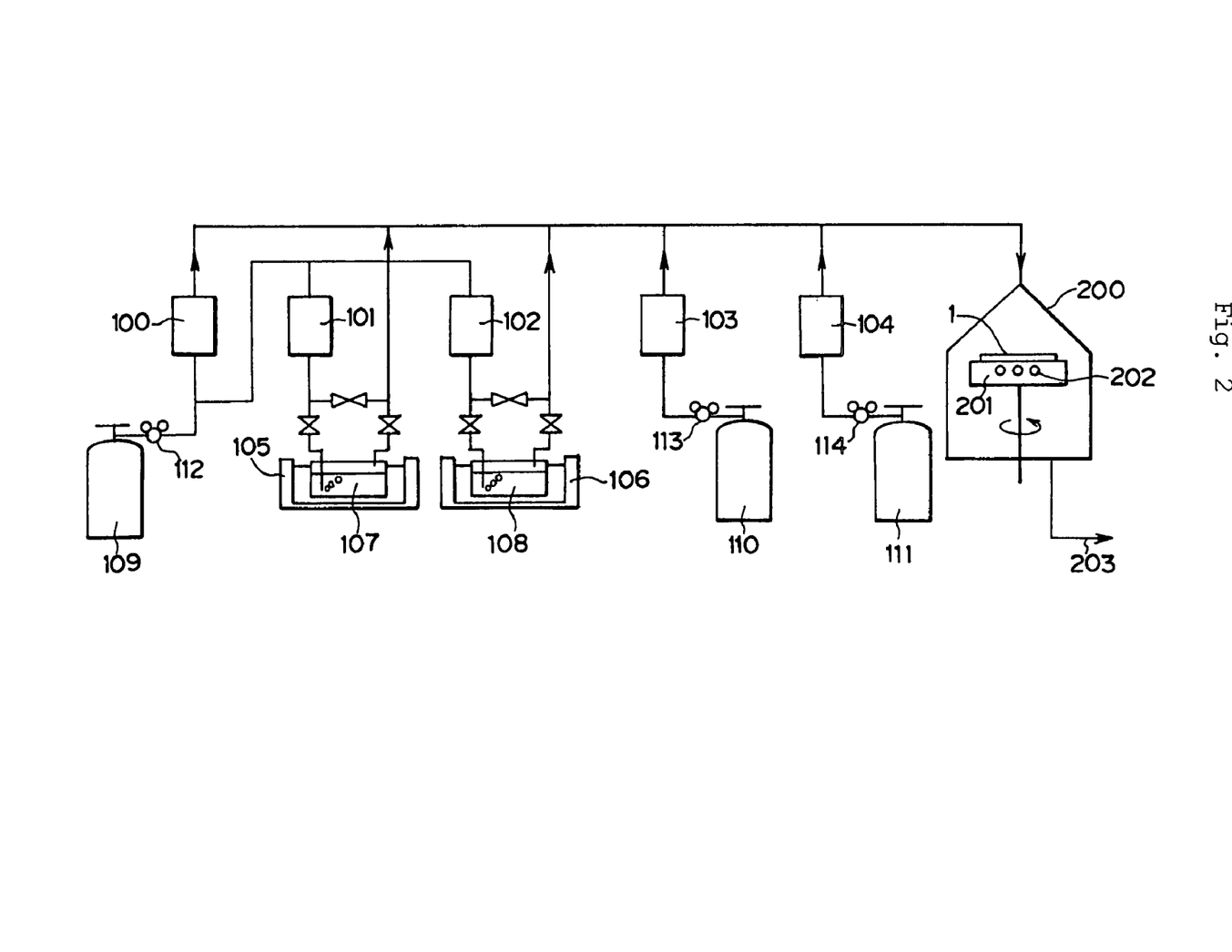
FIG. 2 is a schematic view of metal organic chemical vapor deposition apparatus used for manufacturing the semiconductor epitaxial crystal substrate according to the present invention.

FIG. 2 is a schematic view of a MOCVD apparatus used for manufacturing the semiconductor epitaxial crystal substrate. In FIG. 2, each of 100 to 104 indicates a mass flow controller (hereinafter referred to as a MFC), each of 105 and 106 indicates a thermostatic bath, each of 107 and 108 indicates a material vessel, each of 109 to 111 indicates a high-pressure gas cylinder, each of 112 to 114 indicates a pressure-reducing valve, 200 indicates a reactor, 201 indicates a photoresistance heater, and 202 indicates a substrate holder. The material vessel 107 is filled with a group III material, and the material vessel 108 is filled with an organic metal material. The high-pressure gas cylinder 111 is filled with ammonia, the high-pressure gas cylinder 109 is filled with a carrier gas, and the high-pressure gas cylinder 110 is filled with an oxygen gas.

The carrier gas from the high-pressure gas cylinder 109 with a flow rate thereof controlled by the MFC 101 is introduced into the material vessel 107 with a temperature thereof controlled to a desired temperature by the thermostatic bath 105, and bubbled in the group III material filled in the material vessel 107. Due to the bubbling, upper space in the material vessel 107 is filled with the group III material with a vapor pressure determined by a temperature of the thermostatic bath 107, and a group III material gas of an amount corresponding to the vapor pressure and the flow rate of the carrier gas is introduced into the reactor 200. The flow rate of the group III material thus controlled is normally in a range of 10 E−3 to 10 E−5 mol/min.

A group V material (ammonia or the like) filled in the high-pressure gas cylinder 111 is decompressed by the pressure-reducing valve 114, the flow rate thereof is controlled by the MFC 104, and introduced into the reactor 200. The amount of the group V material (ammonia or the like) is normally 1 to 10000 times that of the group III material gas.

The pressure-reducing valve 112 decompresses the carrier gas filled in the high-pressure gas cylinder 109, the flow rate thereof is controlled by the MFC 100, and introduced into the reactor 200. The flow rate of the carrier gas is normally in a range of 10 SLM to 200 SLM. Silane serving as a dopant may be introduced into the reactor 200 by a method similar to that used for the group V material.

The carrier gas from the high-pressure gas cylinder 109 with the flow rate thereof controlled by the MFC 102 is introduced into the material vessel 108 with a temperature thereof controlled to a desired temperature by the thermostatic bath 106, and bubbled in the organic metal material filled in the material vessel 108. Due to the bubbling, upper space in the material vessel 108 is filled with the organic metal material with a vapor pressure determined by a temperature of the thermostatic bath 106, and an organic metal material gas of an amount corresponding to the vapor pressure and the flow rate of the carrier gas is introduced into the reactor 200.

The substrate holder 201 made of graphite provided in the reactor 200 holds the base substrate 1. The substrate holder 201 has a rotating mechanism, and the photoresistance heater 201 is disposed on a back surface of the substrate holder 201 to heat the base substrate 1 from the back surface through the substrate holder 110. For a GaN semiconductor crystal, the heating may be performed such that a surface temperature of the base substrate 1 falls in a range of about 900° C. to about 1300° C.

The material gases introduced into the reactor 200 are thermally decomposed in the vicinity of the surface of the base substrate 1, and are grown as a crystal on the base substrate 1. A residual gas and an undecomposed gas are exhausted from an exhaust vent 203. In this manner, by introducing the material gases into the reactor 200, a GaN crystal doped with silicon or a GaN crystal not doped with silicon is grown on the base substrate 1.

Examples of the group III material used for crystal growth include alkyl gallium such as trimethyl gallium (TMG), triethyl gallium (TEG), or the like, alkyl aluminum such as trimethyl aluminum (TMA), triethyl aluminum (TEA), or the like, and alkyl indium such as trimethyl indium (TMI). The group III materials may be used singly or in combination so as to obtain a desired composition. The group III materials are commercially available for use in MOCVD.

Examples of a silicon material serving as a dopant include disilane and monosilane. Because disilane and monosilane having high purities required for the crystal growth are commercially available, the commercially available disilane or monosilane may be used.

Examples of the carrier gas include a hydrogen gas and a nitrogen gas. They may be used singly or in combination. Because the carrier gas having high purity required for the crystal growth is also commercially available, the commercially available carrier gas may be used.

Examples of the base substrate 1 include single crystal substrates such as GaAs, GaN, sapphire, SiC, and Si. The base substrate 1 may be either insulating or conductive, and is preferably insulating. For the base substrate 1, because a base substrate with few defects required for the crystal growth is commercially available, the commercially available base substrate may be used.

Next, a description will be given of the method for manufacturing the epitaxial crystal substrate for the GaN-MISH-FET shown in FIG. 1 with reference to FIG. 2.

A cleaned semi-insulating SiC base substrate 1 is loaded on the substrate holder 202, and the AlN buffer layer 2 having a predetermined thickness is grown on the base substrate 1.

The thickness of the AlN buffer layer 2 is normally from 500 Å to 5000 Å and, in terms of balance between productivity and effect, the thickness is preferably from 200 Å to 4000 Å, and more preferably from 200 Å to 3000 Å. An AlGaN buffer layer having the same thickness may be used instead of the AlN buffer layer 2. In this case, the AlGaN buffer layer may be grown by a method similar to that in the case with the AlN buffer layer 2 except that the material gases are changed so as to obtain a desired composition. In terms of an increase in insulating properties of the buffer layer 2, the buffer layer 2 may be doped with Fe, Mn, C, or the like.

By changing a temperature of the base substrate 1 to a predetermined temperature and changing the group III material gas, the Si-type GaN channel layer 3 having a predetermined thickness is grown. The thickness of the channel layer 3 may be determined in a range in which excellent crystallinity can be imparted to a portion formed with a 2 DEG channel in the vicinity of an interface with the electron supply layer 4. An assessment of the crystallinity may be performed by the measurement of rocking curve by XRD. As a target crystal plane to be measured, for example, a (0001) plane may be used. In a case where the (0001) plane is measured, when a half value width of a peak is not more than 300 seconds, excellent properties can be obtained.

A thickness of the channel layer 3 is normally not less than 3000 Å, and extremely dependent on growth conditions. In terms of an increase in productivity, the thickness is preferably in a range of not less than 5000 Å and not more than 50000 Å, more preferably in a range of 7000 Å to 40000 Å, and even more preferably in a range of 8000 Å to 30000 Å.

Next, the electron supply layer 4 that is doped with or not doped with Si by supplying or not supplying a silicon dopant gas is grown to a predetermined thickness. The thickness and an Al composition of the electron supply layer 4 may be determined in a range in which the crystal is not degraded due to a lattice mismatch with the channel layer 3 so as to obtain desired channel carrier concentration, mutual conductance, and pinch-off voltage. Because when the Al composition is increased, the lattice mismatch with the channel layer 3 is increased, therefore, the thickness is reduced. The range of the thickness is normally from 50 Å to 500 Å, preferably from 70 Å to 450 Å, and more preferably from 90 Å to 400 Å. The Al composition is normally from 0.1 to 0.4, preferably from 0.15 to 0.35, and more preferably from 0.18 to 0.30.

After the growth of the electron supply layer 4 as the uppermost layer of the GaN crystal is thus completed, a substrate obtained by this process is maintained in the reactor 200 without exposing the substrate to the atmosphere, and the dielectric layer 5 is grown on the electron supply layer 4. The electron supply layer 4 and the dielectric layer 5 may be continuously grown in the same reactor. After the electron supply changing the substrate temperature to a predetermined temperature and introducing the oxygen containing material as well as TMA as the group III material gas into the reactor 200 grow layer 4, an $Al_2O_3$ dielectric material having a predetermined thickness may be grown as the dielectric layer 5. In this manner, the epitaxial crystal substrate shown in FIG. 1 is obtained. In the process step of growing the dielectric layer 5, MOCVD may be used.

In order to grow an oxide dielectric material other than the $Al_2O_3$ dielectric material as the dielectric layer 5, an organic metal required for growing the oxide dielectric material is introduced into the material vessel 108 to grow the GaN crystal as in the case with the $Al_2O_3$ dielectric material, and the oxide dielectric material is grown without exposing the crystal surface to the atmosphere. For example, after the GaN crystal is grown, by changing the temperature of the base substrate 1 to a desired temperature and introducing the organic metal gas required for growing the dielectric layer 5 into the reactor 200, the dielectric layer 5 is grown.

Similarly to the case with the introduction of the group III material, the introduction of the organic metal gas may be performed by bubbling the carrier gas with the flow rate thereof controlled by the MFC 102 in the material vessel 108 filled with the organic metal. At that time, the oxygen gas filled in the high-pressure gas cylinder 110 which is decompressed by the pressure-reducing valve 113, and of which the flow rate is controlled by the MFC 103 may be introduced into the reactor 200 simultaneously with the organic metal gas.

Although the case where the dielectric layer 5 is an oxide dielectric material has been described, the dielectric layer 5 may be a composite dielectric material of an oxide and a nitride of the same metal. The growth of the dielectric layer 5 composed of such a composite dielectric material may be performed by using the nitrogen containing material (ammonia) in combination. Because the nitrogen containing material having purity suitable for the crystal growth is commercially available, the commercially available nitrogen containing material may be used. The introduction of the nitrogen containing material may be performed by the method used for the GaN crystal growth.

When the dielectric material is $Al_2O_3$, examples of the organic metal material used for growing the dielectric material include TMA and TEA. When the dielectric material is $HfO_2$, examples of the organic metal material include tetratertiary-butoxy hafnium. When the dielectric material is $SiO_2$, examples of the organic metal material include tris(dimethylamino)silane and tris(diethylamino)silane. When the dielectric material is MgO, examples of the organic metal material include bis(cyclopentadienyl)magnesium and bis(ethylcyclopentadienyl)magnesium. Because these materials each having purity suitable for the crystal growth are commercially available, the commercially available materials may be used.

Examples of the oxygen material include oxygen, water, and ether such as dimethyl ether, diethyl ether, or n-butyl ether. Because these materials each having purity suitable for the crystal growth are commercially available, the commercially available materials may be used.

Growth temperature is dependent on decomposition temperature of the organic metal material. When the dielectric material is $Al_2O_3$, the growth temperature is normally from about 500° C. to about 1100° C., preferably from about 600° C. to about 900° C., and more preferably from about 700° C. to about 800° C. When the dielectric material is $HfO_2$, the growth temperature is normally from about 200° C. to about 800° C., preferably from about 250° C. to about 700° C., and more preferably from about 300° C. to about 600° C. When the dielectric material is $Si_3N_4$, the growth temperature is normally from about 400° C. to about 900° C., preferably from about 450° C. to about 800° C., and more preferably from about 500° C. to about 700° C. When the dielectric material is MgO, the growth temperature is normally from about 200° C. to about 800° C., preferably from about 250° C. to about 700° C., and more preferably from about 300° C. to about 600° C.

In addition, the dielectric layer 5 may also be $Al_2O_3$:N ($Al_2O_3$ containing N), $SiO_2$:N ($SiO_2$ containing N), $Ga_2O_3$, $Hf_xAl_yO_3$ (0<x<1, y=2−½x), $Hf_xAl_yO_3$:N ($Hf_xAl_yO_3$ containing N) (0<x<1, y=2−½x), $HfO_2$, GdO, $ZrO_2$, or $Ta_2O_5$.

The thickness of the dielectric layer may be determined by considering a dielectric constant of the dielectric material, an aimed threshold voltage of a transistor, and gain characteristics, a gate leak current may be suppressed within a range in which the mutual conductance and the pinch-off voltage for achieving the excellent threshold voltage and the gain characteristics are obtained, and the thickness is normally from about 1 nm to about 30 nm.

Although the description has been given thus far mainly to the method for manufacturing the epitaxial crystal substrate for the GaN-heterojunction field effect transistor (HFET) with the $Al_2O_3$ dielectric material, the manufacturing method according to the present invention comprises a process step of growing the semiconductor epitaxial crystal layer and the dielectric layer in the MOCVD growth chamber, and can be applied to semiconductor crystals that can be grown by MOCVD. Examples of such crystals include a silicon germanium (SiGe), a gallium nitride (GaN), an indium phosphate (InP), and a silicon carbide (SiC).

By changing the structure of the semiconductor crystal layer, there can be manufactured epitaxial crystal substrates for a MODFET and a MESFET each having an FET structure and epitaxial crystal substrates for various diodes. Moreover, the manufacturing method can also be applied to a light emitting device such as a light emitting diode (LED) or the like.

EXAMPLE

Although the present invention will be described in greater detail by showing examples, the scope of the present invention is not limited thereto.

Example 1

Using the apparatus shown in FIG. 2, the semiconductor epitaxial substrate having a layer structure shown in FIG. 1 was manufactured. A semi-insulating SiC substrate was used as the base substrate 1. By heating the semi-insulating SiC substrate to 1000° C., and by setting the flow rate of hydrogen at 60 SLM as the carrier gas, ammonia at 40 SLM, and carrier gas through TMA vessel at 40 sccm (standard cc/min) with a thermostatic bath temperature set to 30° C., the AlN buffer layer 2 was grown on the semi-insulating SiC substrate by a thickness of 1000 Å. After the substrate temperature was changed to 1150° C. and a the flow rate of carrier gas through TMA vessel was set to 0 sccm, the flow rate of carrier gas through TMG vessel was set at 40 sccm with the thermostatic bath temperature set to 30° C., the GaN channel layer 3 was grown on the AlN buffer layer 2 by a thickness of 20000 Å. By flowing carrier gas through TMA vessel at 40 sccm with the thermostatic bath temperature set to 30° C., an AlGaN electron supply layer 4 was grown on the GaN channel layer 3 by a thickness of 300 Å.

Without unloading the substrate from the apparatus, by changing the substrate temperature to 900° C., stopping the supply of TMG and ammonia, and supplying diethyl ether at 400 sccm, $Al_2O_3$ was grown by a thickness of 50 Å, whereby the dielectric layer 5 was obtained. Thereafter, by cooling the substrate and unloading the substrate from the reactor, there was obtained an epitaxial substrate with a dielectric film having the layer structure shown in FIG. 1.

Figure 3:
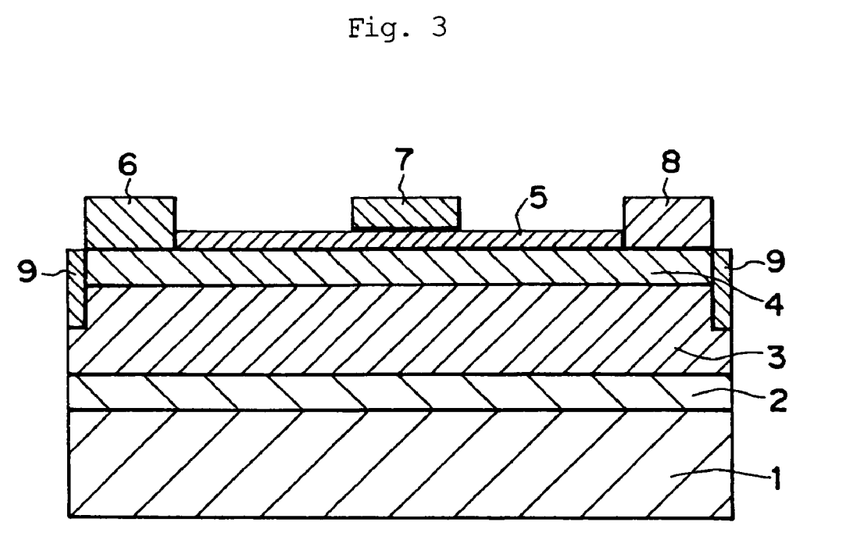
FIG. 3 is a schematic cross-sectional view of a GaN-MISHFET in EXAMPLE 1.

Using the obtained epitaxial substrate with the dielectric film, a GaN-MISHFET having a structure shown in FIG. 3 was manufactured in the following manner. After a photoresist pattern was formed on the epitaxial substrate with the dielectric film by photolithography, a device isolation 9 was formed to a depth of 3000 Å by implanting $N^+$ ions. Photoresist openings were formed so as to correspond to shapes of a source electrode and a drain electrode by photolithography, and the portions of the dielectric layer 5 at the opening portions were removed by ICP plasma etching using a mixture gas of Ar, $CH_2Cl_2$, and $Cl_2$ to expose the AlGaN electron supply layer 4.

After a metal film of Ti (thickness of 200 Å)/Al (thickness of 1500 Å)/Ni (thickness of 250 Å)/Au (thickness of 500 Å) was deposited on an entire surface of the substrate, the metal film was processed into the shapes of the electrodes by a lift-off. The substrate was subjected to a RTA treatment under a nitrogen atmosphere at 800° C. for 30 seconds to form a source electrode 8 and a drain electrode 6. An opening in the shape of a gate electrode was formed by photolithography, a metal film of Ni (thickness of 200 Å)/Au (thickness of 1000 Å) was deposited on an entire surface of the opening, and the metal film was processed into the shape of the electrode by the lift-off, whereby a gate electrode 7 was formed.

The substrate was annealed under the nitrogen atmosphere at 500° C. for 30 minutes. In this manner, the GaN-MISHFET with a gate length of 2 μm and a gate width of 30 μm having the $Al_2O_3$ or AlN dielectric layer 5 as a layer functioning as the gate insulator and the passivation film was manufactured.

Comparative Example

After the AlGaN electron supply layer 4 was grown, by cooling the substrate without growing the dielectric material, and performing the same operations as in EXAMPLE 1 except that the substrate was unloaded from the reactor, the GaN-MISHFET with the gate length of 2 μm and the gate width of 30 which did not have the gate insulator or the passivation film was manufactured.

Figure 4:
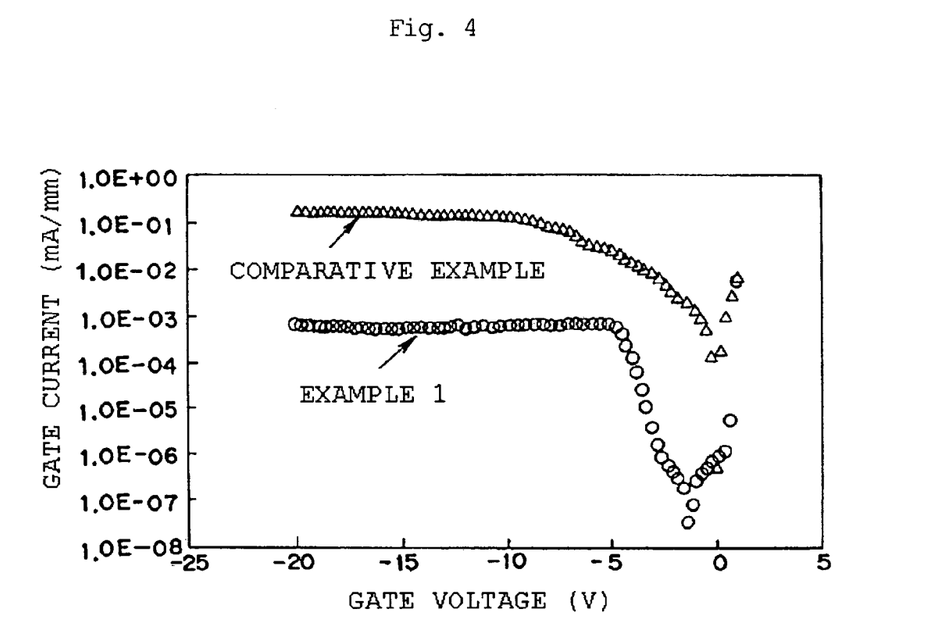
FIG. 4 shows gate leak characteristics (a gate voltage-gate current characteristic) of the GaN-MISHFETs in EXAMPLE 1 and COMPARATIVE EXAMPLE.

With regard to the GaN-MISHFETs obtained in EXAMPLE 1 and COMPARATIVE EXAMPLE, measurement results of a gate voltage-gate current characteristic were shown in FIG. 4. As shown in FIG. 4, the GaN-MISHFET obtained in EXAMPLE 1 had a gate current at the time of application of a negative gate voltage lower by about two digits than that in COMPARATIVE EXAMPLE, and exhibited an excellent gate leak characteristic.

Figure 5:
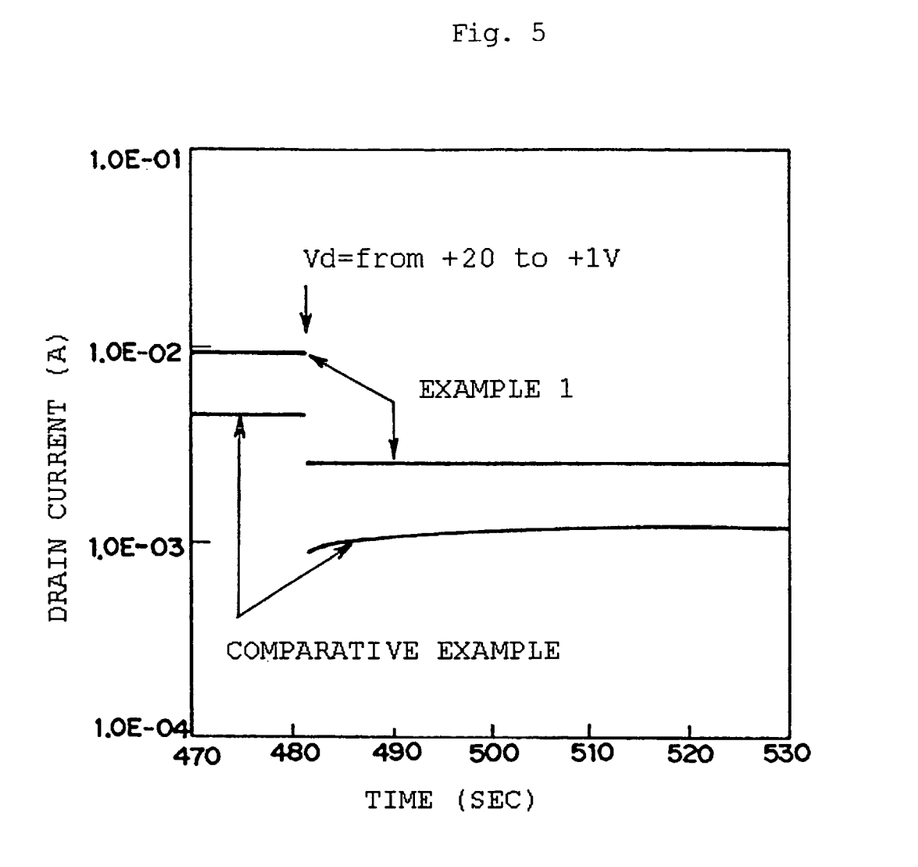
FIG. 5 shows drain lag characteristics (a drain voltage-drain current-time characteristic) of the GaN-MISHFETs in EXAMPLE 1 and COMPARATIVE EXAMPLE.

With regard to the GaN-HFETs obtained in EXAMPLE 1 and COMPARATIVE EXAMPLE, evaluation results of a drain lag characteristic (a drain voltage-drain current-time characteristic) were shown in FIG. 5. The evaluation was performed by a method in which the source electrode and the gate electrode were grounded, and a change in transient current of a current was measured from the time when the application of +1 V was started when the drain voltage was abruptly changed from +20 V to +1 V. As shown in FIG. 5, the GaN-HFET in EXAMPLE 1 indicated a steady-state current value from a time immediately after the drain voltage was changed from +20 V to +1 V. On the other hand, in the GaN-HFET in COMPARATIVE EXAMPLE, when the drain voltage was changed from +20 V to +1 V, the drain current value continued to gradually increase instead of immediately becoming a constant value, and it required time for the drain current value to become the steady-state value. That is, a drain lag which presented a problem in a device operation was seen. From this result, it was found that the GaN-MISHFET with the dielectric film in EXAMPLE 1 exhibited an excellent drain lag characteristic.

Example 2

Using the apparatus shown in FIG. 2, the semiconductor epitaxial substrate having the layer structure shown in FIG. 1 was manufactured. By loading the semi-insulating SiC substrate in the reactor 200, heating the semi-insulating SiC substrate to 1000° C., and flowing hydrogen at 60 SLM as the carrier gas, ammonia at 40 SLM, and carrier gas through TMA vessel at 40 sccm with the thermostatic bath temperature set to 30° C. into the reactor 200, the AlN buffer layer was grown on the semi-insulating SiC substrate by a thickness of 1000 Å. By changing the substrate temperature to 1150° C., and setting the flow rate of carrier gas through TMG vessel at 40 sccm with the thermostatic bath temperature set to 30° C. after setting a TMA flow rate to 0 sccm, the GaN channel layer was grown on the AlN buffer layer by a thickness of 20000 Å. By setting the flow rate of carrier gas through TMA vessel at 40 sccm with the thermostatic bath temperature set to 30° C., the AlGaN electron supply layer was grown on the GaN channel layer by a thickness of 300 Å. By changing the substrate temperature to 700° C., stopping the supply of TMG, changing the carrier gas from hydrogen to nitrogen, and supplying carrier gas through n-butyl ether vessel at flow rate of 40 sccm, the $Al_xO_y$ dielectric layer was grown on the AlGaN electron supply layer by a thickness of 200 Å. An atomic ratio of the dielectric layer was determined by X-ray photoelectron spectroscopy. It was found that x:y=6:4 was satisfied. By cooling the substrate and unloading the substrate from the reactor 200, the semiconductor epitaxial substrate with the dielectric film was obtained.

Photoresist openings were formed so as to correspond to the shapes of the source electrode and the drain electrode in the semiconductor epitaxial substrate by photolithography, and the portions of the dielectric film at the opening portions were removed by ICP plasma etching using the mixture gas of Ar, $CH_2Cl_2$, and $Cl_2$ to expose the AlGaN layer. The metal film of Ti (thickness of 200 Å)/Al (thickness of 1500 Å)/Ni (thickness of 250 Å)/Au (thickness of 500 Å) was deposited on the entire surface of the substrate, and the metal film was processed into the shapes of the electrodes by the lift-off.

The obtained semiconductor epitaxial substrate was subjected to the RTA treatment under the nitrogen atmosphere at 800° C. for 30 seconds to form a source electrode 206 and a drain electrode 204. After the photoresist pattern was formed on the semiconductor epitaxial substrate by photolithography, the device isolation layer was formed to a depth of 3000 Å by implanting $N^+$ ions. An opening in the shape of the gate electrode was formed by photolithography, the metal film of Ni (thickness of 200 Å)/Au (thickness of 1000 Å) was deposited on the entire surface of the opening, and the metal film was processed into the shape of the electrode by the lift-off to form the gate electrode, whereby there was obtained the GaN-MISHFET with the gate length of 2 μm and the gate width of 30 μm having the dielectric layer (AlO) as a layer functioning as the gate insulator and the passivation film.

The obtained GaN-MISHFET had a leak current of $2\times10^{-5}$ mA/mm at the time of application of gate bias of −10 V, and it was found that the leak current characteristic thereof was improved when compared with the GaN-MISHFET in EXAMPLE 1. In addition, it was found that the GaN-MISHFET in EXAMPLE 2 had a current collapse which was as low as that in EXAMPLE 1.

INDUSTRIAL APPLICABILITY

According to the present invention, there can be obtained a semiconductor epitaxial substrate with a dielectric film having a low gate leak current and negligibly low gate lag, drain lag, and current collapse characteristics. The semiconductor epitaxial substrate is suitably used for a gallium nitride semiconductor and a field effect transistor.

The invention claimed is:

1. A method for manufacturing a semiconductor epitaxial crystal substrate in which a dielectric layer of a nitride dielectric material or an oxide dielectric material in an amorphous form functioning as a passivation film or a gate insulator is provided on a surface of a nitride semiconductor crystal layer grown by metal organic chemical vapor deposition, comprising:
   growing the nitride semiconductor crystal layer in an epitaxial growth furnace; and then
   growing the dielectric layer on the nitride semiconductor crystal layer in the epitaxial growth furnace.

2. The method for manufacturing a semiconductor epitaxial crystal substance according to claim 1, wherein the dielectric layer is grown using an organic metal as a metal material, ether or water as an oxygen material, and ammonia as a nitrogen containing material by the metal organic chemical vapor deposition.

3. The method for manufacturing a semiconductor epitaxial crystal substance according to claim 2, wherein at least a part of the growth of the dielectric layer is performed while ammonia as a group V material is supplied.

4. The method for manufacturing a semiconductor epitaxial crystal substance according to claim 1, wherein at least using nitrogen as a carrier gas performs a part of the growth of the dielectric layer.

5. The method for manufacturing a semiconductor epitaxial crystal substance according to claim 1, wherein the dielectric layer contains at least one dielectric material selected from among $AlO_x$, $AlO_x$:N (0.5<x<1.5), $SiO_2$, $SiO_2$:

N, $Ga_2O_3$, $Si_3N_4$, $HfO_2$, $Hf_xAl_yO_3$ ($0<x<1$, $y=2-\frac{1}{2}x$), $Hf_xAl_yO_3$:N ($0<x<1$, $y=2-\frac{1}{2}x$), GdO, $ZrO_2$, MgO, and $Ta_2O_5$.

6. The method for manufacturing a semiconductor epitaxial crystal substance according to claim 1, wherein the dielectric layer contains at least one dielectric material selected from among $Al_2O_3$, $Al_2O_3$:N, $SiO_2$, $SiO_2$:N, $Ga_2O_3$, $Si_3N_4$, $HfO_2$, $Hf_xAl_yO_3$ ($0<x<1$, $y=2-\frac{1}{2}x$), $Hf_xAl_yO_3$:N ($0<x<1$, $y=2-\frac{1}{2}x$), GdO, $ZrO_2$, MgO, and $Ta_2O_5$.

7. The method of claim 1, wherein the semiconductor epitaxial crystal substrate is used for a field effect transistor.

8. The method for manufacturing a semiconductor epitaxial crystal substance according to claim 2, wherein at least using nitrogen as a carrier gas performs a part of the growth of the dielectric layer.

* * * * *